United States Patent
Kubo et al.

(10) Patent No.: US 8,618,623 B2
(45) Date of Patent: Dec. 31, 2013

(54) SOLID-STATE IMAGE PICKUP DEVICE AND METHOD FOR MANUFACTURING SAME, AND IMAGE PICKUP APPARATUS

(75) Inventors: Norihiro Kubo, Kanagawa (JP); Hiroaki Ishiwata, Tokyo (JP); Sanghoon Ha, Kanagawa (JP)

(73) Assignee: Sony Corporation, Tokyo (JP)

( * ) Notice: Subject to any disclaimer, the term of this patent is extended or adjusted under 35 U.S.C. 154(b) by 77 days.

(21) Appl. No.: 13/149,053

(22) Filed: May 31, 2011

(65) Prior Publication Data

US 2011/0304000 A1    Dec. 15, 2011

(30) Foreign Application Priority Data

Jun. 14, 2010   (JP) .................. 2010-135612

(51) Int. Cl.
- *H01L 31/0232* (2006.01)
- *H01L 31/00* (2006.01)
- *H01L 27/14* (2006.01)
- *H01L 31/062* (2012.01)
- *H01L 31/113* (2006.01)

(52) U.S. Cl.
USPC ........... 257/432; 257/443; 257/291; 257/414; 257/431

(58) Field of Classification Search
USPC .......... 257/432, 443, 291, 229, 223, 232, 140, 257/146, 257, 258, 225, 414, 431, 444, 446
See application file for complete search history.

(56) References Cited

U.S. PATENT DOCUMENTS

| | | | | |
|---|---|---|---|---|
| 2001/0054726 A1* | 12/2001 | Abe | ............... | 257/292 |
| 2005/0035375 A1* | 2/2005 | Hirata | ............ | 257/225 |
| 2007/0042519 A1* | 2/2007 | Nomura et al. | ........... | 438/34 |
| 2007/0052056 A1* | 3/2007 | Doi et al. | ........ | 257/462 |
| 2011/0049590 A1* | 3/2011 | Itonaga | .......... | 257/292 |

FOREIGN PATENT DOCUMENTS

JP    2002-164529    6/2002

* cited by examiner

*Primary Examiner* — Chuong A. Luu
(74) *Attorney, Agent, or Firm* — Dentons US LLP

(57) ABSTRACT

Disclosed herein is a solid-state image pickup device of a type wherein a pixel is configured to include a sensor unit capable of photoelectric conversion, the image pickup device including: a semiconductor substrate; a charge storage region of a first conduction type, which is formed in the semiconductor substrate and constitutes a sensor unit; a charge storage sub-region made of an impurity region of the first conduction type, which is formed, in plural layers, in the semiconductor substrate below the charge storage region serving as a main charge storage region and wherein at least one or more of the plural layers are formed entirely across a pixel; and a device isolation region that is formed in the semiconductor substrate, isolates pixels from one another, and is made of an impurity region of a second conduction type.

4 Claims, 8 Drawing Sheets

F I G . 2
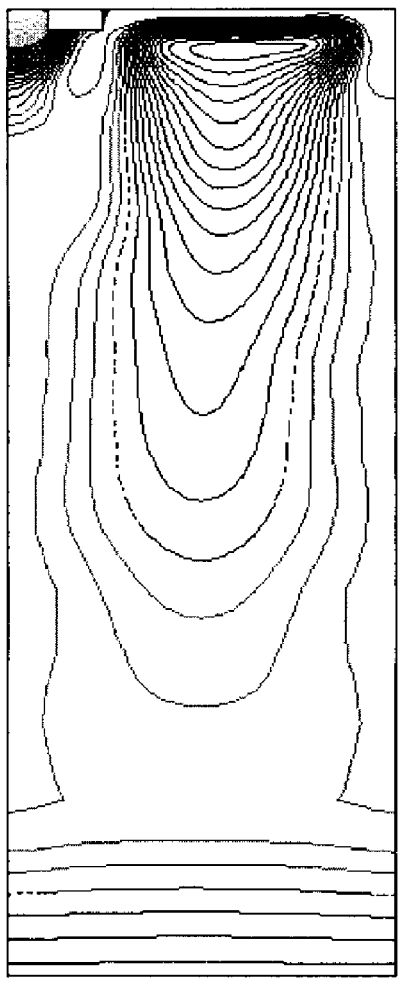

SOLID-STATE IMAGE PICKUP DEVICE AND METHOD FOR MANUFACTURING SAME, AND IMAGE PICKUP APPARATUS

BACKGROUND

This disclosure relates to a solid-state image pickup device and a method for manufacturing same, and also to an image pickup apparatus provided with the solid-state image pickup device.

In solid-state image pickup devices, in order to make up for reduction in charge storage capacitance ascribed to the miniaturization of pixels being advanced, it has been proposed to additionally form, aside from a charge storage region of an existing sensor unit, an impurity region of the same conduction type as the charge storage region therebelow.

Further, there has been proposed a charge storage unit wherein ions having different energies are injected plural times into below a charge storage region to form a plurality of impurity regions, followed by combination with a known charge storage region (see, for example, Japanese Patent Laid-open No. 2002-164529).

In this Patent Application, a CCD (charge-coupled device) solid-state image pickup device is described. With respect to a CMOS (complementary metal-oxide semiconductor) solid-state image pickup device, a plurality of impurity regions may be likewise formed beneath a storage image pickup region of a sensor unit thereby configuring a charge storage unit.

A schematic configuration view (sectional view) of the CMOS solid-state image pickup device configured in this way is shown in FIGS. 5A and 5B. FIG. 5A is a sectional view at a face orthogonal to a transfer gate and 5B is a sectional view, taken along line X-X' of FIG. 5A.

It will be noted that although a first charge storage unit and a second charge storage unit are mentioned in the Laid-open Patent Application No. 2002-164529, the hitherto known charge storage region is called herein main charge storage region and the lower impurity region is called charge storage sub-region.

The solid-state image pickup device shown in FIGS. 5A and 5B is configured such that individual pixels are isolated with a $P^+$ device isolation region 53, and a photodiode (PD) of a sensor unit and a charge transfer portion are formed at the inside isolated with the device isolation region 53. In the figures, indicated by 51 is a semiconductor substrate (i.e. a semiconductor substrate or a semiconductor substrate and a semiconductor epitaxial layer formed thereon) and by 52 is a $p^-$ semiconductor well region formed as buried in the semiconductor substrate 51. An overflow barrier is formed by the semiconductor well region 52.

In this solid-state image pickup device, an n-type charge storage sub-region is formed particularly beneath an $n^+$-type charge storage region 54 of a sensor unit. The charge storage sub-region is constituted of three n-type impurity regions including a first charge storage sub-region 61, a second charge storage sub-region 62 and a third charge storage sub-region 63 as viewed from below.

The charge storage sub-region formed of the first charge storage sub-region 61, second charge storage sub-region 62 and third charge storage sub-region 63 acts to increase a charge storage capacitance over the case where the charge storage region 54 alone is deeply formed.

In this way, it becomes possible to make up for the reduction of a charge storage capacitance when pixels are miniaturized and to suppress sensitivity from lowering as will be caused by the miniaturization of the pixels.

Additionally, photoelectrons photoelectrically converted at a deep region of a photodiode can be efficiently transferred.

The first, second and third charge storage sub-regions 61, 62, 63 can be successively formed by n-type impurity ion injections of different energy levels.

The potential distribution diagram at the section of FIG. 5B is shown in FIG. 6.

As shown in FIG. 6, a potential distribution extended in a direction of depth is formed by the formation of the charge storage sub-regions 61, 62, 63.

When an n-type impurity is subjected to multistage cycles of ion injection to form charge storage sub-regions, such a potential along the depth can be designed.

SUMMARY

As will be seen from FIG. 5A, the charge storage sub-regions 61, 62, 63 formed for the aim of improving sensitivity are formed only below the charge storage region 54, i.e. at the inside of the photodiode.

This is for the aim of suppressing white spots from being worsened and also suppressing an overflow of stored charges ascribed to the pinning degradation at the deep portion of the photodiode.

Also in the structure provided with this charge storage sub-region, as the miniaturization of pixels is advanced, an effective area of the photodiode is reduced.

At the section of FIG. 5B, the distance between the $p^+$ device isolation regions becomes narrower than that at the section of FIG. 5A.

Therefore, in the deep portion of the photodiode, the potential is constricted owing to an increased effective concentration of the p-type impurity caused by the device isolation region 53 and the semiconductor well region 52. This is illustrated with reference to FIG. 7.

FIG. 7 shows the device isolation region 53 and the semiconductor well region 52, which are the p-type impurity regions, after superposing the sectional structure of FIG. 5B over the potential diagram of FIG. 6.

As shown in FIG. 7, an increased effective concentration in the p-type impurity regions (i.e. the device isolation region 53 and the semiconductor well region 52) causes the n-type impurity region to be constricted with respect to the potential thereof as indicated by the arrows.

This leads to the unlikelihood of a depletion layer being extended to the depth and sensitivity may take a value lower than a designed one.

As a matter of course, as set out in the Japanese Laid-open Patent Application No. 2002-164529, when compared with the case where a charge storage region alone is deeply formed, the provision of the charge storage sub-regions mitigates the potential constriction along with an effect of extending the potential toward a direction of depth.

In association with further progress in miniaturization of pixels, however, only the provision of the charge storage sub-regions does not become satisfactory.

Accordingly, further ingenuity becomes necessary for securing sensitivity associated with the pixel miniaturization.

In order to solve the above problems, the embodiment of the present technology contemplates to provide a solid-state image pickup device and a method for manufacturing same wherein if pixel miniaturization is further advanced, satisfactory sensitivity can be secured, and also to a solid-state image pickup apparatus including the solid-state image pickup device.

The solid-state image pickup device of the embodiment of the disclosure is one that is constituted of pixels including a sensor unit capable of photoelectric conversion therein.

A semiconductor substrate and a charge storage region of a first conduction type, which is formed in the semiconductor substrate and serves as a sensor unit, are included.

There is further included a charge storage sub-region made of an impurity region of the first conduction type, which is formed, in plural layers, in the semiconductor substrate beneath the charge storage region serving as a main charge storage region and wherein at least one or more of the plural layers is formed entirely across the pixel.

Moreover, a device isolation region that is formed in the semiconductor substrate, isolates pixels from one another, and is made of an impurity region of a second conduction type.

The method for manufacturing a solid-state image pickup device of the embodiment of the disclosure is one wherein pixels are constituted each including a sensor unit capable of photoelectric conversion.

The method includes forming a charge storage sub-region made of an impurity region of a first conduction type entirely of pixels within a semiconductor substrate, and forming plural layers of a charge storage sub-region made of an impurity region of the first conduction type.

Further, the method includes forming a device isolation region isolating pixels in the semiconductor substrate and made of an impurity region of a second conduction type and forming a charge storage region of the first conduction type serving as a sensor unit on the plural layers of the charge storage sub-region in the semiconductor substrate.

The image pickup apparatus of the embodiment of the disclosure includes a focusing optical unit focusing incoming light, a solid-state image pickup device receiving the incoming light focused by the focusing optical unit and subjecting to photoelectric conversion, a signal processing unit processing a signal obtained by the photoelectric conversion in the solid-state image pickup device.

According to the solid-state image pickup device of the embodiment of the disclosure, the plural layers of the charge storage sub-region made of an impurity region of the first conduction type are formed in the semiconductor substrate below the charge storage region of the first conduction type serving as a main charge storage region. When compared with the case where a charge storage region alone is deeply formed, the potential can be extended toward a direction of depth by the provision of the charge storage sub-region.

Further, because at least one or more of the plural layers of the charge storage sub-region is formed entirely across a pixel, an effective dose amount of the impurity of the first conduction type at the depth of the sensor unit can be increased. This leads to mitigation of the potential constriction from the impurity region of the second conduction type around the charge storage sub-region and allows a potential distribution in the sensor unit to be spread along a direction of depth and also a depletion layer in the sensor unit to be extended along a direction of depth, thereby enabling a saturated charge quantity in the sensor unit to be increased.

According to the method for manufacturing a solid-state image pickup device of the embodiment of the disclosure, a charge storage sub-region made of an impurity region of a first conduction type is formed entirely across pixels in a semiconductor substrate and forming plural layers of the charge storage sub-region made of an impurity region of the first conduction type including the charge storage sub-region formed entirely across the pixels. This enables a solid-state image pickup device to be made as having a structure wherein a depletion layer in a sensor unit to be extended along a direction of depth thereby ensuring an increased saturated charge quantity in the sensor unit.

According to an image pickup apparatus of the embodiment of the disclosure, the solid-state image pickup apparatus includes such a solid-state image pickup device of this disclosure that a saturated charge quantity in the sensor unit can be increased in the image pickup device, ensuring satisfactory sensitivity.

According to the embodiment of the disclosure, the solid-state image pickup device enables a saturated charge quantity in a sensor unit to be increased, thereby improving the sensitivity of the sensor unit.

Hence, satisfactory sensitivity can be secured if pixel miniaturization is advanced. Thus, pixels can be miniaturized with the possibility that the number of pixels can be increased and down-sizing of a solid-state image pickup device can be realized.

According to the embodiment of the disclosure, if the number of pixels of a solid-state image pickup device is increased or a solid-state image pickup device is down-sized, there can be realized a solid-state image pickup apparatus whose sensitivity is satisfactory.

BRIEF DESCRIPTION OF THE DRAWINGS

FIG. 2 is a potential distribution diagram of a portion corresponding to the sectional view of FIG. 1B;

DETAILED DESCRIPTION OF THE PREFERRED EMBODIMENTS

Embodiments for carrying out the disclosure are now described.

The description is made in the following order.
1. First Embodiment (Solid State Image Pickup Device)
2. Second Embodiment (Image Pickup Apparatus)
<1. First Embodiment>

Figure 1A:
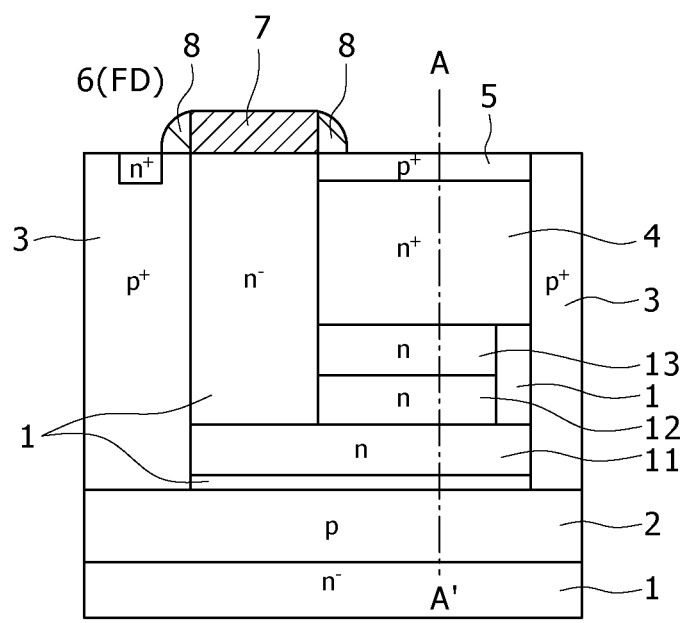
FIGS. 1A and 1B are, respectively, a schematic configuration view (sectional view) of a solid-state image pickup device according a first embodiment of the disclosure.
Figure 1B:
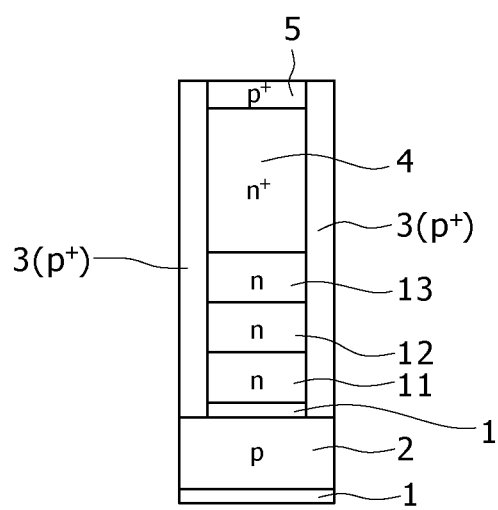

The schematic configuration view (sectional view) of a solid-state image pickup device according to the first embodiment of the disclosure is shown in FIGS. 1A and 1B. FIG. 1A shows a sectional view at a face intersecting at a right angle with a transfer gate and FIG. 1B shows a sectional view taken along line A-A' of FIG. 1A.

This solid-state image pickup device is configured to form, on a surface of an n⁻ semiconductor substrate 1 made of silicon or other semiconductor, a photodiode (PD) of a sensor unit, a charge transfer unit in the form of a transfer gate 7, and a floating diffusion (FD) 6.

As the semiconductor substrate 1, there can be used a semiconductor substrate (silicon substrate or the like) or a semiconductor substrate and a semiconductor epitaxial layer formed thereon.

A p-type semiconductor well region 2 is formed as buried in the semiconductor substrate 1.

This semiconductor well region 2 is formed across an entire surface of a pixel region or an entire surface of a chip of the solid-state image pickup device and isolates the substrate and the pixel unit from each other. An overflow barrier is formed by means of this semiconductor well region 2.

Individual pixels are isolated with $p^+$ device isolation regions 3 above the semiconductor well region 2. In the inside isolated with the device isolation region 3, the photodiode (PD) serving as a sensor unit and the charge transfer unit are formed.

At the portion of the photodiode, an $n^+$ charge storage region 4 is formed, and a $p^+$ positive charge storage region 5 for suppressing a dark current is formed on the surface of the charge storage region 4.

At the charge transfer unit, a transfer gate 7 is formed via a thin gate insulating film, not shown, on the surface of the semiconductor substrate 1 and a side wall 8 made of an insulating layer is formed at the side walls of the transfer gate 7.

The transfer gate 7 may be formed, for example, of polysilicon.

In the surface of the device isolation region 3 provided at the left side of the figure, an $n^+$ floating diffusion (FD) 6 is formed.

The floating diffusion 6 and the positive charge storage region 5 of the sensor unit are, respectively, formed as set in position with the transfer gate 7 at an outside thereof.

It will be noted that as a variation of the configuration of FIG. 1A, there may be formed the positive charge storage region 5 in position with an outer edge of the side wall 8 at the outer side of the transfer gate 7.

The transfer gate 7 serves to transfer charges between the photodiode and the floating diffusion 6. The floating diffusion 6 stores transferred charges.

The charge storage sub-region is formed below the charge storage region 4 and includes three n-type impurity regions of a first charge storage sub-region 11, a second charge storage sub-region 12 and a third charge storage sub-region 12 as viewed from below.

These charge storage sub-regions 11, 12, 13 are formed above the p-type semiconductor well region 2, i.e. at a depth position between the semiconductor well region 2 and the charge storage region 4.

Figure 5A:
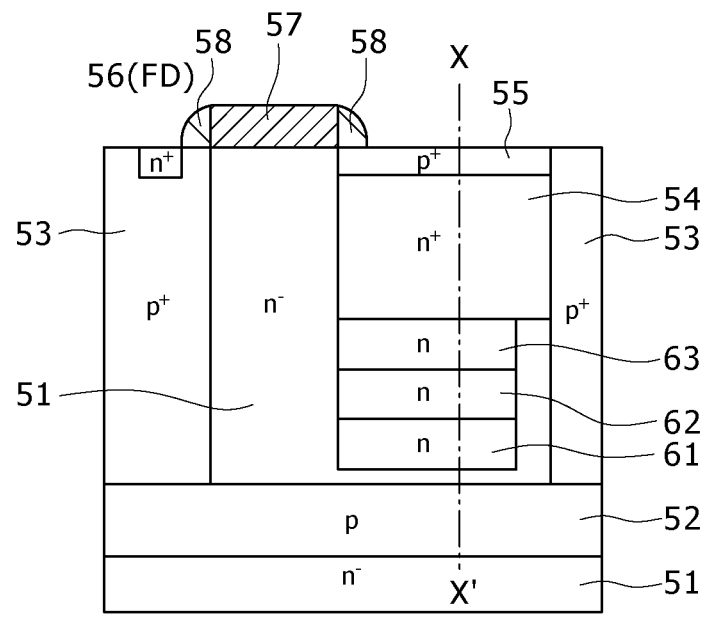
FIGS. 5A and 5B are, respectively, a schematic configuration view (sectional view) of a solid-state image pickup device having a structure wherein charge storage sub-regions are formed beneath a main charge storage region.
Figure 5B:
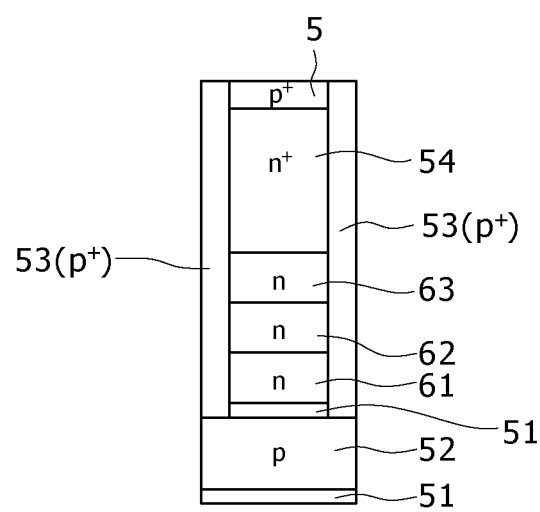

The distance between the $p^+$ device isolation regions 3 becomes narrower at the section of FIG. 1B than at the section of FIG. 1A, like the section shown in FIG. 5B.

Therefore, with the configuration of the section of FIG. 1B, the potential is constricted at the deep portion of the photodiode owing to an increased effective concentration of the p-type impurities from the device isolation region 3 and the semiconductor well region 2.

To avoid this, in this embodiment, the first charge storage sub-region 11, which is innermost among the three charge storage sub-regions 11, 12, 13, is formed as extended to the device isolation region 3. That is, the first charge storage sub-region 11 is formed entirely across the pixel.

The potential distribution diagram at the section of FIG. 1B is now shown in FIG. 2.

Figure 6:
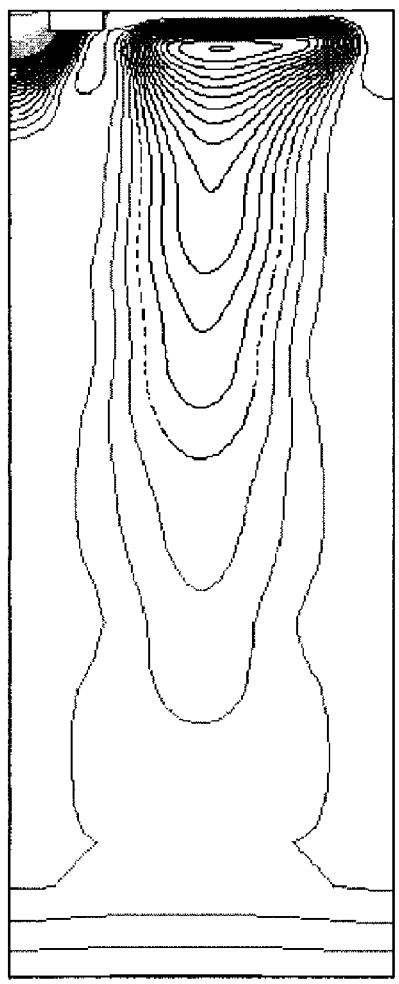
FIG. 6 is a potential distribution diagram of a portion corresponding to the sectional view of FIG. 5B.
Figure 7:
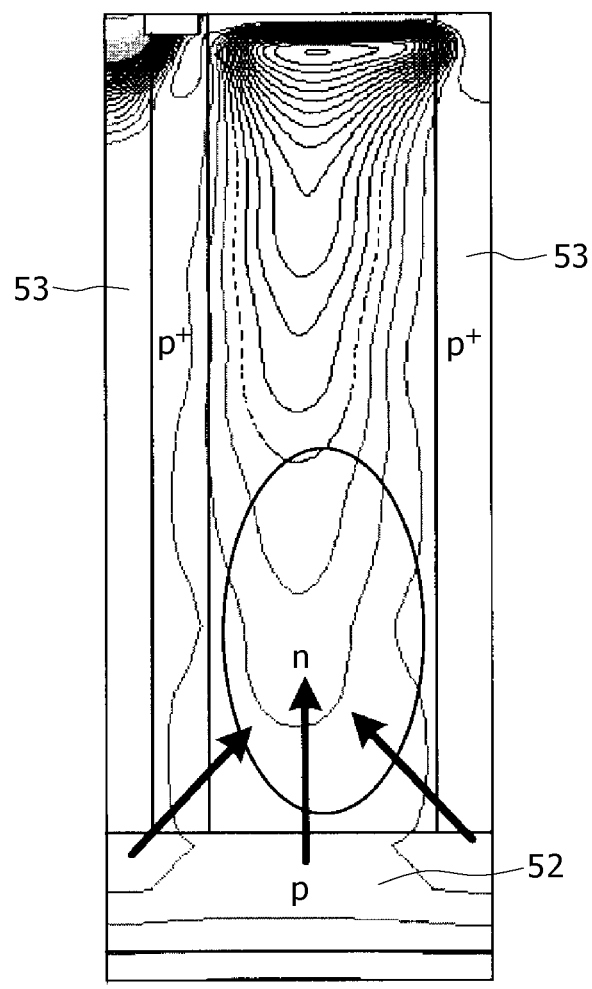
FIG. 7 is a view illustrating a potential variation in the solid-state image pickup device of FIGS. 5A and 5B.

Since the first charge storage sub-region 11 is widely formed sufficiently to extend to the device isolation region 3, such a potential distribution as shown in FIG. 2 can be formed, which is extended along a direction of depth over the potential distribution shown in FIG. 6.

This is because an effective dose amount of an n-type impurity in the deep portion of the photodiode can be increased by the wide formation of the first charge storage sub-region 11, so that the constriction of the potential from the surrounding p-type impurity regions 2, 3 can be mitigated.

Since the potential distribution can be widened along a direction of depth, the depletion layer within the photodiode can be elongated toward a direction of depth, resulting in improved sensitivity.

More preferably, the first charge storage sub-region 11 formed entirely across the pixel is formed at a position of a depth of not smaller than 1 μm from the surface of the semiconductor substrate 1.

This enables the depletion layer to be extended at a depth of not smaller than 1 μm thereby obtaining satisfactory sensitivity to light in a long wavelength region of visible light.

The solid-state image pickup device according to this embodiment can be made in a manner illustrated hereinbelow.

Figure 3A:
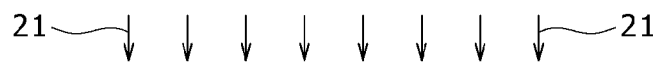
FIGS. 3A to 3E are, respectively, a process chart showing a method of manufacturing the solid-state image pickup device of FIGS. 1A and 1B.
Figure 3A:
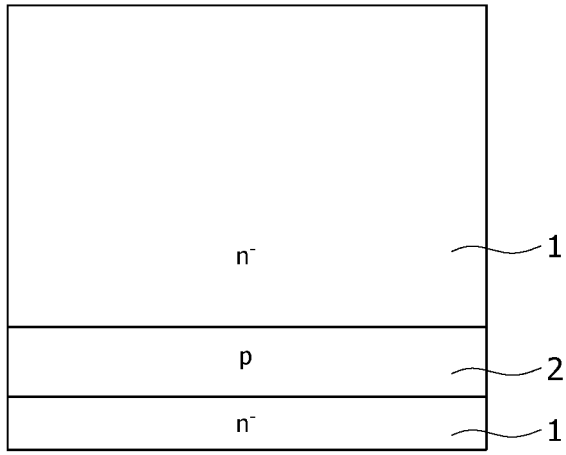

Initially, as shown in FIG. 3A, a p-type semiconductor well 2 serving as an overflow barrier is formed, by ion injection 21 of a p-type impurity, across the entirety of a semiconductor substrate 1 or the entirety of an image pickup region at a position of a certain depth of the semiconductor substrate 1.

Figure 3B:
Figure 3B:
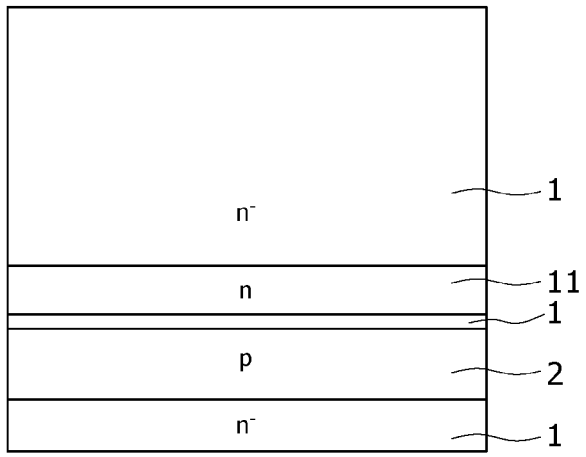

Next, as shown in FIG. 3B, a first charge storage sub-region 11 is formed by ion injection 22 of an n-type impurity over the semiconductor well region 2 across the entirety of the semiconductor substrate 1.

Figure 3C:
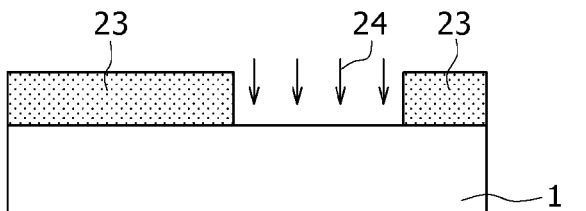
Figure 3C:
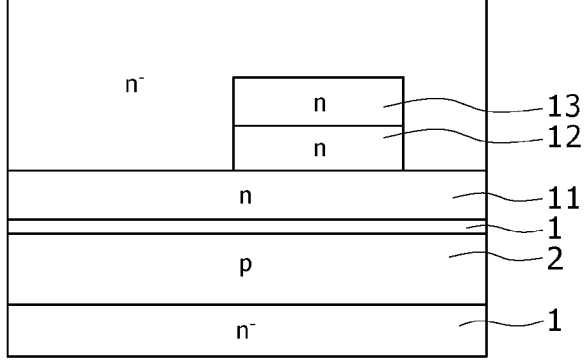

Next, as shown in FIG. 3C, using a resist 23 as a mask, a second charge storage sub-region 12 and a third charge storage sub-region 13 are successively formed on the first charge storage sub-region 11 by ion injection 24 of an n-type impurity.

It will be noted that the ion injection for forming the first charge storage sub-region 11, ion injection for forming the second charge storage sub-region 12 and ion injection for forming the third charge storage sub-region 13 are carried out at different energies (the order of energy magnitude is such that first>second>third).

Figure 3D:
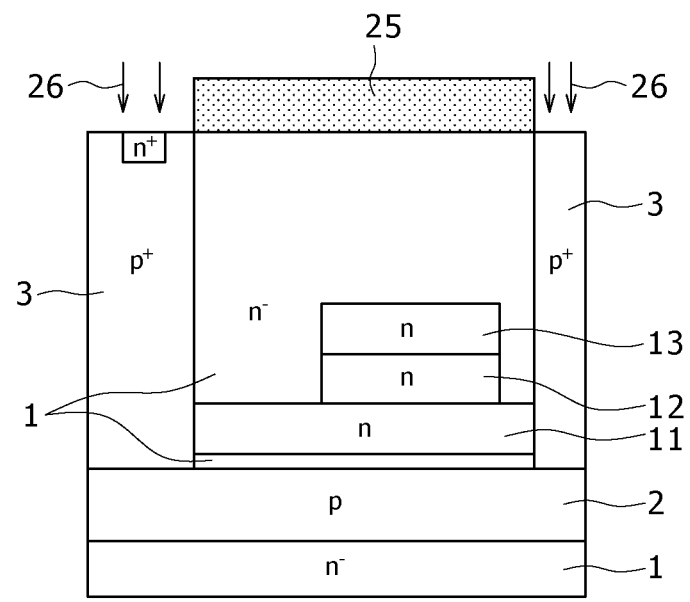

Next, as shown in FIG. 3D, using a resist 25 as a mask, a $p^+$ device isolation region 3 is formed so as to surround the photodiode of the sensor unit by ion injection 26 of a p-type impurity.

At this stage, an injection amount of the p-type impurity is so selected as to strike back at the n-type impurity ion-injected entirely across the semiconductor substrate 1. This enables a potential at a boundary region between the device isolation region 3 and the photodiode to be designed to prevent blooming, color mixing and white spots from being worsened.

By forming the $p^+$ device isolation region 3 in this way, the n-type first charge storage sub-region 11 is isolated for every pixel.

Figure 3E:
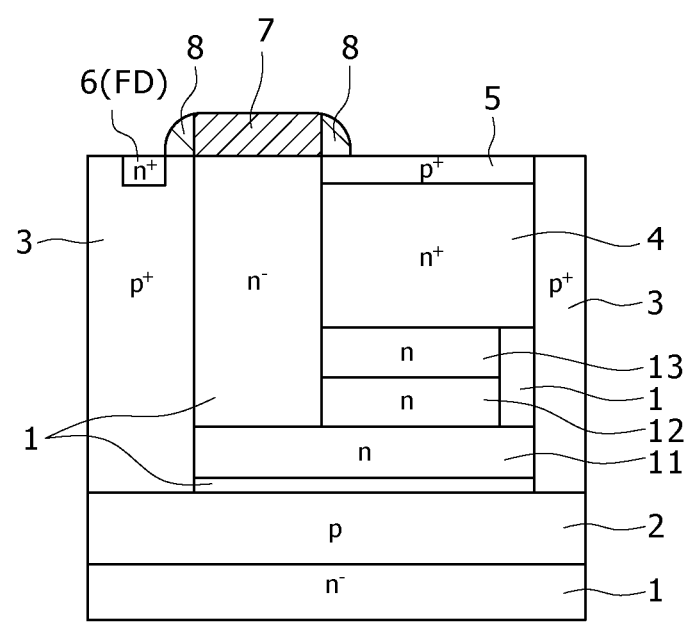

Subsequently, as shown in FIG. 3E, a charge storage region 4, a positive charge storage region 5, a floating diffusion (FD) 6, a transfer gate 7 and a side wall 8 are, respectively, formed. These can be formed by hitherto known techniques.

For instance, after the formation of the transfer gate 7, while using the transfer gate 7 as a mask, the $n^+$ charge storage region 4 is formed by ion injection of an n-type impurity and the $p^+$ positive charge storage region 5 is formed by ion injection of a p-type impurity. The side wall 8 made of an insulating layer is formed on the side walls of the transfer gate 7, and using this side wall 8 as a mask, the floating diffusion (FD) 6 is formed by ion injection of an n-type impurity.

Thereafter, a color filter, an on-chip lens and upper wiring layers may be, respectively, formed, if necessary.

In this way, the solid-state image pickup device shown in FIGS. 1A and 1B can be made.

According to the solid-state image pickup device of this embodiment, the first charge storage sub-region 11, which is the lowermost layer of the three n-type charge storage regions 11, 12 and 13, is formed as extended to the device isolation region 3 and thus, the first charge storage sub-region 11 is formed entirely across the pixel. This enables an effective dose amount of an n-type impurity at the depth of the photodiode to be increased and thus, the constriction of the potentials from the surrounding p-type impurity regions 2, 3 can be mitigated to widen a potential distribution toward a direction of depth.

More particularly, the depletion layer in the photodiode can be elongated along a direction of depth and a saturated charge amount can be increased, thereby improving the sensitivity of the photodiode.

Accordingly, according to the solid-state image pickup device of the embodiment, if a pixel is miniaturized, satisfactory sensitivity is ensured. Hence, an increasing number of pixels and down-sizing of a solid-state image pickup device can be realized by the pixel miniaturization.

With above-stated embodiment, only the first charge storage region 11 is formed entirely across the pixel, and the second charge storage region 12 and the third charge storage region 13 are formed only at a portion below the charge storage region 4.

In this disclosure, where a plurality of charge storage sub-regions are formed below the charge storage region, the number of charge storage sub-regions formed entirely across the pixel is arbitrary.

Accordingly, in case where the three charge storage sub-regions 11, 12, 13 as shown in FIGS. 1A and 1B are formed, an arbitrary number of the sub-regions can be formed entirely across the pixel.

More preferably, the charge storage sub-regions formed entirely across a pixel are so configured as to be formed over a position where the depth thereof from the surface of the semiconductor substrate 1 is at not smaller than 1 μm.

It will be noted that the charge storage sub-region formed entirely across the pixel may be formed by ion injection while using a mask having an opening for every pixel instead of the case where they are formed entirely across the semiconductor substrate or image pickup region like the above-stated manufacturing method.

As in the above-stated manufacturing method, easy formation is ensured when the sub-region is formed entirely across the semiconductor substrate or image pickup region and is isolated for every pixel upon formation of a device isolation region.

Although, in the above embodiment, this disclosure is applied to a solid-state image pickup device of a CMOS type wherein the floating diffusion (FD) 6 is provided for every pixel, the disclosure may also be applied to other type of solid-state image pickup device.

For instance, the present disclosure may be applied to a CCD solid-state image pickup device as in the afore-mentioned Japanese Laid-open Patent Application.

In the above embodiment, the charge storage region 4 is formed as an n-type region, with a $p^+$ positive charge storage region being formed on its surface.

In this disclosure, contrary to the above embodiment with respect to the conduction type, such a configuration is possible including a p-type charge storage region and an $n^+$ negative charge storage region formed thereon. In this case, plural layers of a p-type impurity region are formed below the charge storage region for use as a charge storage sub-region and at least one or more of the plural layers of the p-type impurity region is formed entirely across the pixel.

<2. Second Embodiment>

Figure 4:
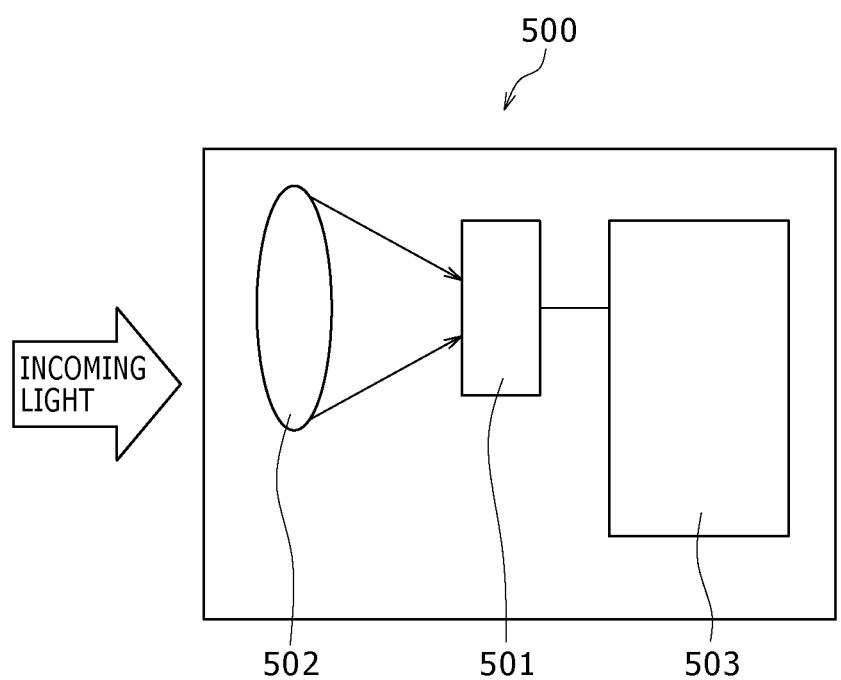
FIG. 4 is a schematic configuration view (block diagram) of an image pickup apparatus according to a second embodiment of the disclosure.

A schematic configuration view (block diagram) of an image pickup apparatus according to a second embodiment of the disclosure is shown in FIG. 4. This image pickup apparatus includes, for example, video cameras, digital still cameras or cameras for cell phone.

As shown in FIG. 4, an image pickup apparatus 500 has an image pickup unit 501 provided with a solid-state image pickup device (not shown).

A focusing optical system 502 for incoming light gathering and image focusing is provided upstream of the image pickup unit 501. At the downstream of the image pickup unit 501, a signal processor 503 having a drive circuit driving the image pickup unit 501 and a signal processing circuit processing signals photoelectrically converted into an image in the solid-state image pickup device are connected. The image signal processed in the signal processor 503 can be memorized in an image memory (not shown).

In such an image pickup apparatus 500, the solid-state image pickup device of the disclosure such as the solid-state image pickup device of the above-described embodiment can be used as a solid-state image pickup device.

According to the image pickup apparatus 500 of the embodiment, there is used the solid-state image pickup device of the disclosure, i.e. a solid-state image pickup device that is configured to ensure satisfactory sensitivity if miniaturization of pixel is advancing, as described hereinbefore.

This is advantageous in that if the number of pixels of a solid-state image pickup device is increased or if a solid-state image pickup device is downsized, there can be configured the image pickup apparatus 500 wherein satisfactory sensitivity is obtained.

It will be noted that the image pickup apparatus of the disclosure is not limited to the configuration shown in FIG. 4, but may be applied to image pickup apparatuses of the types making use of a solid-state image pickup device.

For instance, a solid-state image pickup device may take a form formed as one chip or may be in the form of a module having an image pickup function wherein an image pickup unit and a signal processor or optical system are collectively packaged.

The image pickup apparatus of the disclosure can be applied, for example, to mobile devices having a camera or image pickup function and a variety of image pickup apparatuses. In a broad meaning, "image pickup" includes a fingerprint detector and the like.

The present disclosure should not be construed as limited to those embodiments stated above, but may take various variations and modifications without departing from the scope of the disclosure.

The present disclosure contains subject matter related to that disclosed in Japanese Priority Patent Application JP 2010-135612 filed in the Japan Patent Office on Jun. 14, 2010, the entire content of which is hereby incorporated by reference.

It should be understood by those skilled in the art that various modifications, combinations, sub-combinations and alterations may occur depending on design requirements and other factors in so far as they are within the scope of the appended claims or the equivalents thereof.

What is claimed is:

1. A solid-state image pickup device of a type including a plurality of pixels, each pixel is configured to include a sensor unit capable of photoelectric conversion, said image pickup device comprising:
    a semiconductor substrate;
    a charge storage region of a first conduction type, which is formed in said semiconductor substrate and is configured to be a sensor unit and a main charge storage region;
    a charge storage sub-region made of an impurity region of the first conduction type, said charge storage sub-region comprising a plurality of layers in said semiconductor substrate below said charge storage region ; and
    a device isolation region in the semiconductor substrate configured to isolate said pixels from one another said device isolation region made of an impurity region of a second conduction type,
    wherein,
        at least one charge storage sub-region layer extends across each pixel to the device isolation region.

2. The solid-state image pickup device according to claim 1, wherein, for each pixel, said charge storage sub-region formed entirely across said pixel is formed at a depth of not smaller than 1 μm from a surface of said semiconductor substrate.

3. The solid-state image pickup device according to claim 1, further comprising a semiconductor well region, which is formed entirely across each pixel below said charge storage sub-region in said semiconductor substrate and is made of an impurity region of the second conduction type.

4. An image pickup apparatus comprising:
    a focusing optical unit focusing incoming light;
    a solid-state image pickup device comprising a plurality of pixels, each pixel configured to include a sensor unit capable of photoelectric conversion, the solid-state image pickup device further comprising (a) a semiconductor substrate, (b) a charge storage region of a first conduction type in said semiconductor substrate and configured to be a sensor unit and a main charge storage region, (c) a charge storage sub-region, made of an impurity region of the first conduction type, said charge storage sub-region comprising a plurality of layers in said substrate below said charge storage, and (d) a device isolation region in said semiconductor substrate configured to isolate said pixels from one another, said device isolation region made of an impurity region of a second conduction type,
    wherein,
        at least one charge storage sub-region layer extends across each pixel to the device isolation region; and
    a signal processor processing a signal obtained by the photoelectric conversion with said solid-state image pickup device.

* * * * *